United States Patent [19]
Leourx

[11] Patent Number: 5,316,984
[45] Date of Patent: May 31, 1994

[54] BRIGHT FIELD WAFER TARGET

[75] Inventor: Pierre Leourx, San Antonio, Tex.

[73] Assignee: VLSI Technology, Inc., San Jose, Calif.

[21] Appl. No.: 36,786

[22] Filed: Mar. 25, 1993

[51] Int. Cl.⁵ .......................... H01L 21/30; G03F 9/00
[52] U.S. Cl. ..................................... 437/250; 437/225; 437/228; 437/924; 148/DIG. 102; 148/33; 148/33.2; 356/401
[58] Field of Search ............... 437/225, 228, 924, 250; 148/DIG. 102, 33.2, 33; 356/401

[56] References Cited

U.S. PATENT DOCUMENTS 4,118,230 10/1978 Binder .................................. 356/401
4,824,254 4/1989 Ohtsuka et al. ...................... 356/401

FOREIGN PATENT DOCUMENTS 60-42828 3/1985 Japan ......................... 148/DIG. 102
60-211838 10/1985 Japan ......................... 148/DIG. 102
1-162330 6/1989 Japan ......................... 148/DIG. 102

Primary Examiner—T. N. Quach
Attorney, Agent, or Firm—Douglas L. Weller

[57] ABSTRACT

A composite target used in alignment of layers on a wafer uses alignment marks placed in a target area. First alignment marks are composed of material from a first layer placed on the wafer. As subsequent layers are placed on the wafer, alignment marks composed of material from the subsequent layers are placed within the target area. For example, alignment marks composed of material from a second layer are each placed adjacent to one of the alignment marks composed of material from the first layer. Alignment marks composed of material from a third layer are each placed adjacent to one of the alignment marks composed of material from the second layer. Alignment marks composed of material from a fourth layer are each placed adjacent to the alignment marks composed of material from the third layer. And so on. The alignment marks are, for example, each rectangular in shape.

8 Claims, 6 Drawing Sheets

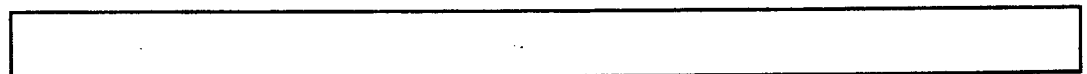
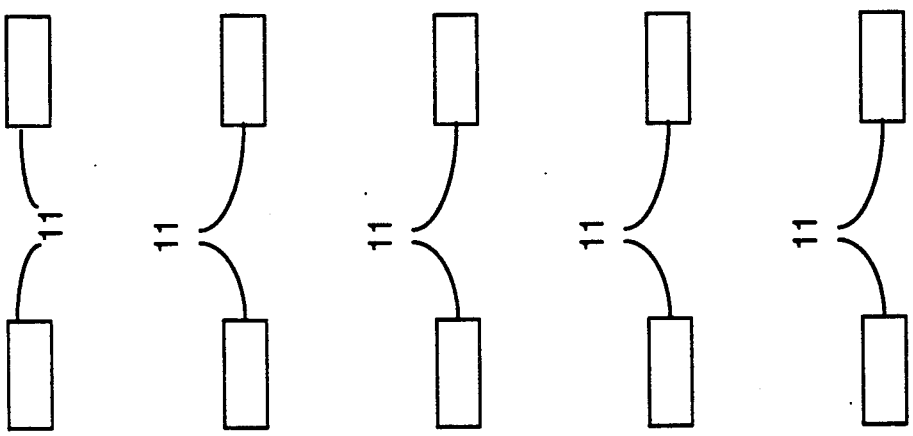
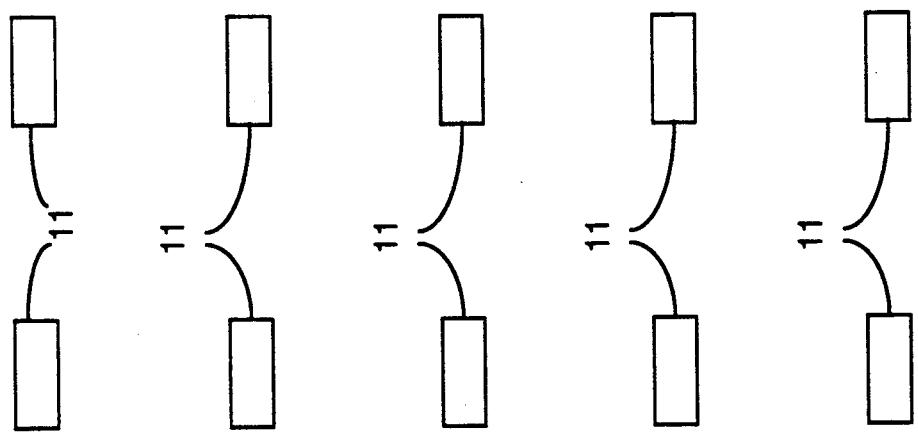
FIG. 2

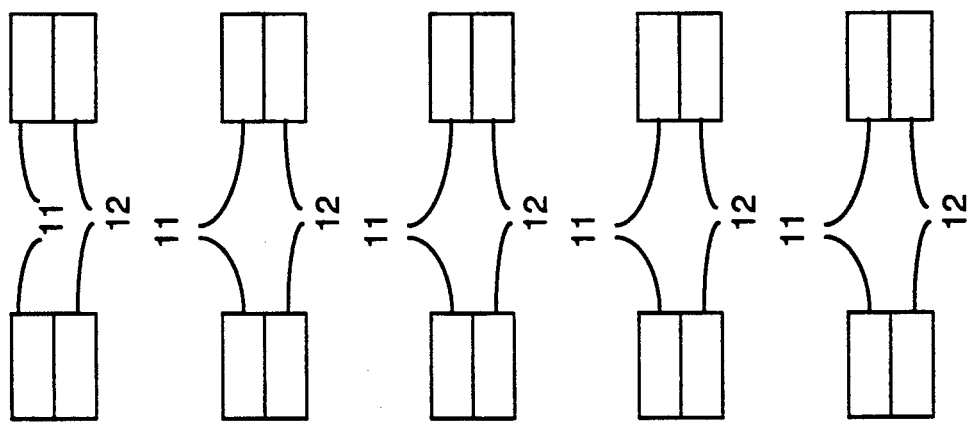
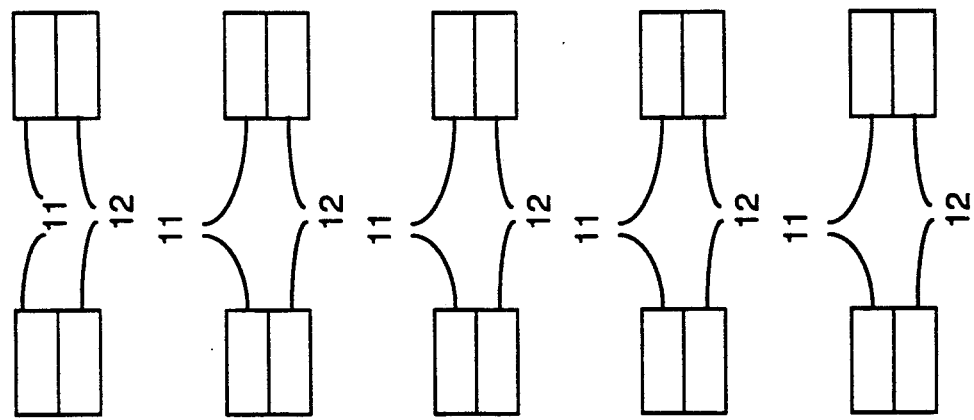
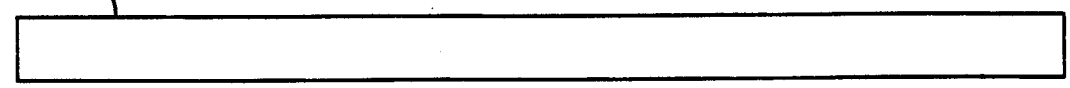

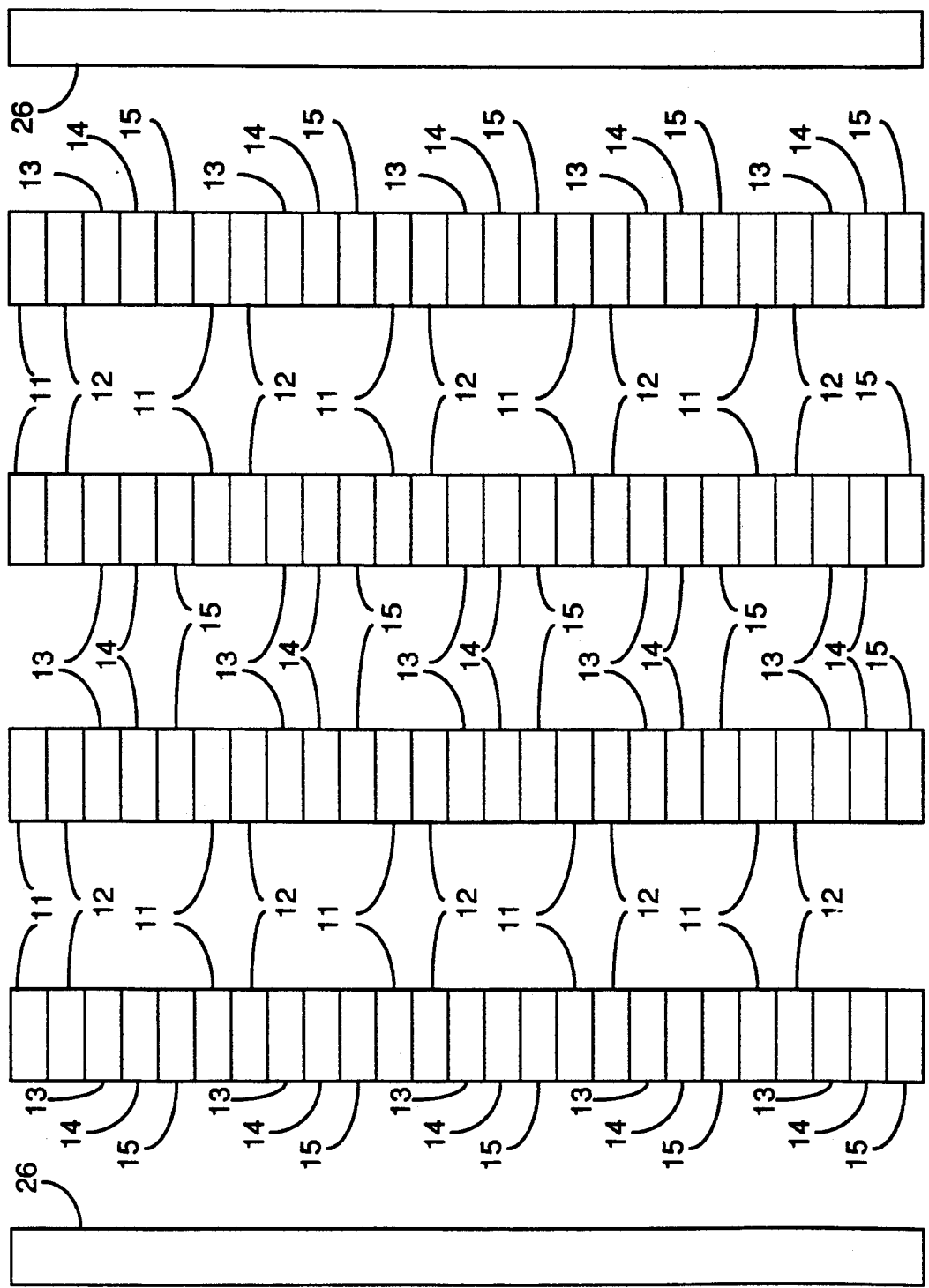

BRIGHT FIELD WAFER TARGET

BACKGROUND

This invention relates generally to processing integrated circuits and more particularly to auto alignment marks used to align layer placement during processing of wafers.

When processing wafers, targets are placed to assure each layer is properly aligned with respect to prior layers. Within the targets, alignment marks are placed. Layers placed subsequent to the alignment marks, utilize the alignment marks for proper placement. The subsequent layer can then be aligned to the mark within an alignment error. The alignment error results from the error tolerances of the processing devices. See for example, Canon Reticle Alignment for Canon I-2000/I-2500 Stepper Model, available from Canon U.S.A. having a business address of 2051 Mission College Blvd., Santa Clara, Calif. 95054.

For example, in a first layer, master marks may be placed in each target. Subsequent layers are all aligned to these first layer master marks. This assures that every layer subsequent to the first layer will be aligned to the first layer within the alignment error. However, one problem with such a master mark alignment system is that the total alignment errors between layers other than the first layer is the square root of two times the alignment error. Thus immediately adjacent layers may be misaligned an amount up to the square root of two times the alignment error. In some processes this amount of error between adjacent layers may be excessive.

Alternately, each layer may include alignment marks for each target. Each layer is aligned using alignment marks composed of material from the immediately prior layer. This guarantees that immediately adjacent layers are misaligned at most an amount equal to the alignment error. However, use of such a sequential mark alignment system may result in a "walking error" wherein misalignment between layers which are not immediately adjacent to one another can be significantly larger than the alignment error.

SUMMARY OF THE INVENTION

In accordance with the preferred embodiment of the present invention, a target used in alignment of layers on a wafer is presented. Within a target area, alignment marks are placed. The alignment marks are composed of material from a first layer placed on the wafer. Also within the target area, as subsequent layers are placed on the wafer, alignment marks composed of material from the subsequent layers are placed within the target area. For example, alignment marks composed of material from a second layer are each placed adjacent to one of the alignment marks composed of material from the first layer. Alignment marks composed of material from a third layer are each placed adjacent to one of the alignment marks composed of material from the second layer. Alignment marks composed of material from a fourth layer are each placed adjacent to one of the alignment marks composed of material from the third layer. And so on. In the preferred embodiment of the present invention, the alignment marks are each rectangular in shape.

The resulting composite target utilizes visible alignment marks for a multitude of layers. This combines the advantages inherent in a master mark alignment scheme and a sequential mark alignment scheme. The present invention is advantageous over the sequential mark alignment scheme as the present invention does not require a new target for every layer, thus saving space in the scribe lines.

BRIEF DESCRIPTION OF THE DRAWINGS

FIG. 2 shows alignment marks from a first layer placed on a target in accordance with the preferred embodiment of the present invention.

FIG. 3 shows alignment marks from a second layer added to the target shown in FIG. 1 in accordance with the preferred embodiment of the present invention.

FIG. 6 shows alignment marks from a fifth layer added to the target shown in FIG. 1 in accordance with the preferred embodiment of the present invention.

DESCRIPTION OF THE PREFERRED EMBODIMENT

Figure 1:
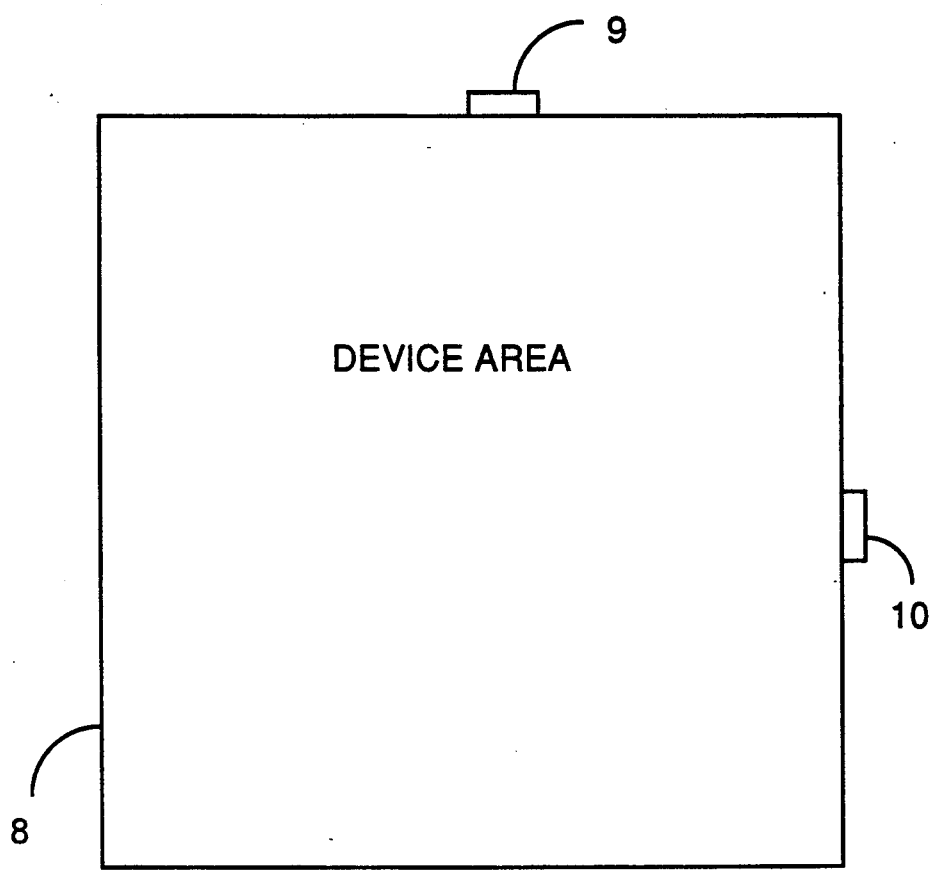
FIG. 1 shows two targets on the scribe lines of the device area on a wafer in accordance with the prior art.

FIG. 1 shows a target 9 and a target 10 on the scribe line of device area 8 of a wafer being processed in accordance with the prior art. Each of target 9 and target 10 are, for example, 120 micrometers by 50 micrometers.

In the preferred embodiment, a composite wafer target is partially built at each layer where an etch is performed. For example the layers may be composed of oxide, polysilicon, metal or some other material used in processing wafers. FIGS. 2 through 6 show processing stages of the composite wafer target in accordance with the preferred embodiment of the present invention. The particular composite wafer target shown being processed is for a process in which five layers are etched.

FIG. 2 shows target area 10 after a first layer is etched. After etching the first layer, alignment marks 11 are exposed within target area 10. Outside lines 22 from the first layer are also exposed. Each of alignment marks 11, for example, has a width of 1.2 micrometers and a height of 4 micrometers. In the shown example, Alignment marks 11 are separated from each other by a distance of, for example, 20 micrometers. While only 20 of alignment marks 11 are shown, a typical target may have, for example, more (or less) than twenty alignment marks for each layer.

FIG. 3 shows target area 10 after a second layer is etched. After etching the second layer, alignment marks 12 are exposed within target area 10. Outside lines 23 from the second layer are also exposed. Outside lines 23 are placed directly over outside lines 22. Each of alignment marks 12, for example, has a width of 1.2 micrometers and a height of 4 micrometers. In the shown example, each of alignment marks 12 is immediately adjacent to one of alignment marks 11.

Figure 4:
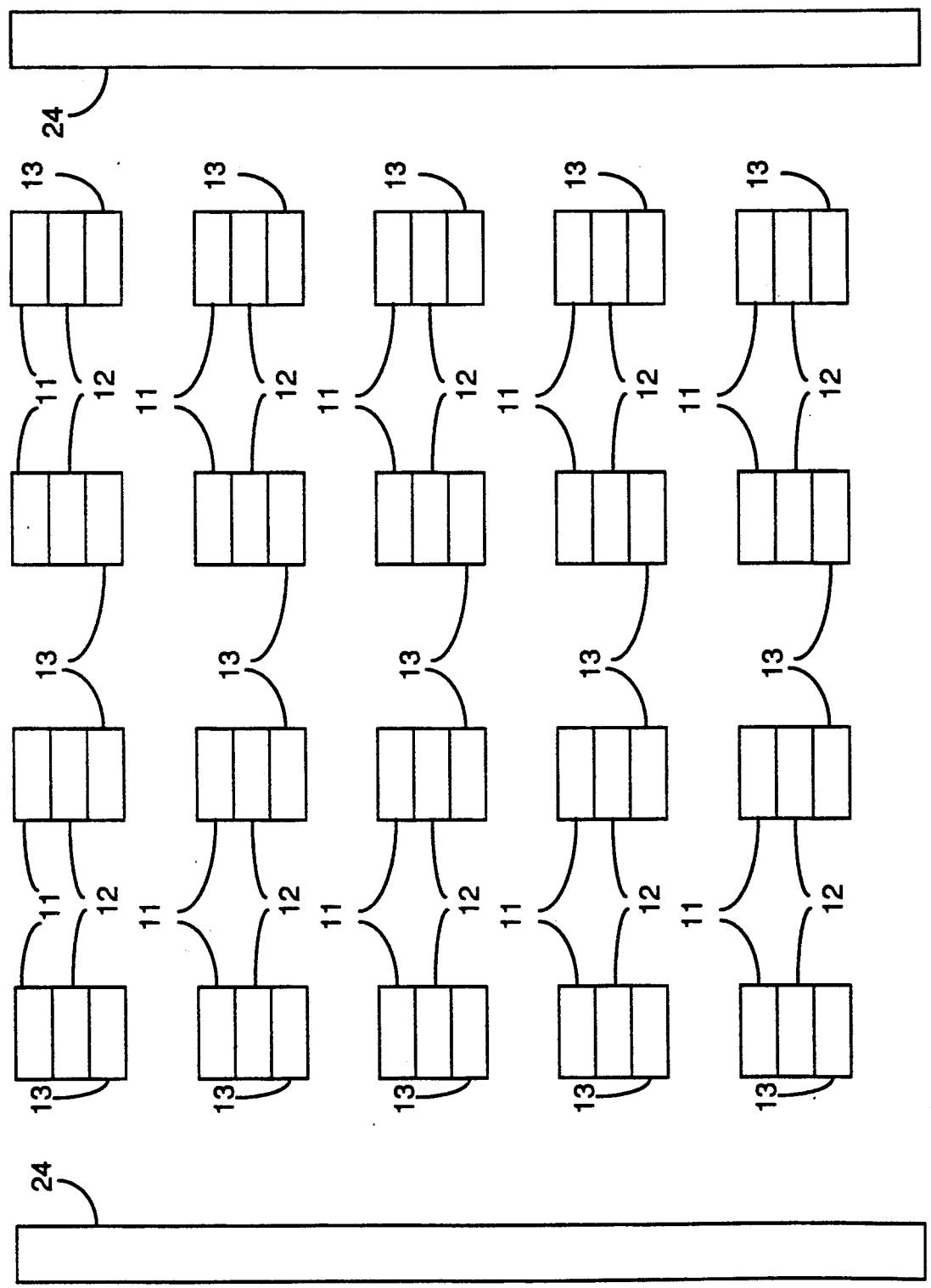
FIG. 4 shows alignment marks from a third layer added to the target shown in FIG. 1 in accordance with the preferred embodiment of the present invention.

FIG. 4 shows target area 10 after a third layer is etched. After etching the third layer, alignment marks 13 are exposed within target area 10. Outside lines 24 from the second layer are also exposed. Outside lines 24 are placed directly over outside lines 23. Each of alignment marks 13, for example, has a width of 1.2 micrometers and a height of 4 micrometers. In the shown example, each of alignment marks 13 is immediately adjacent to one of alignment marks 12.

Figure 5:
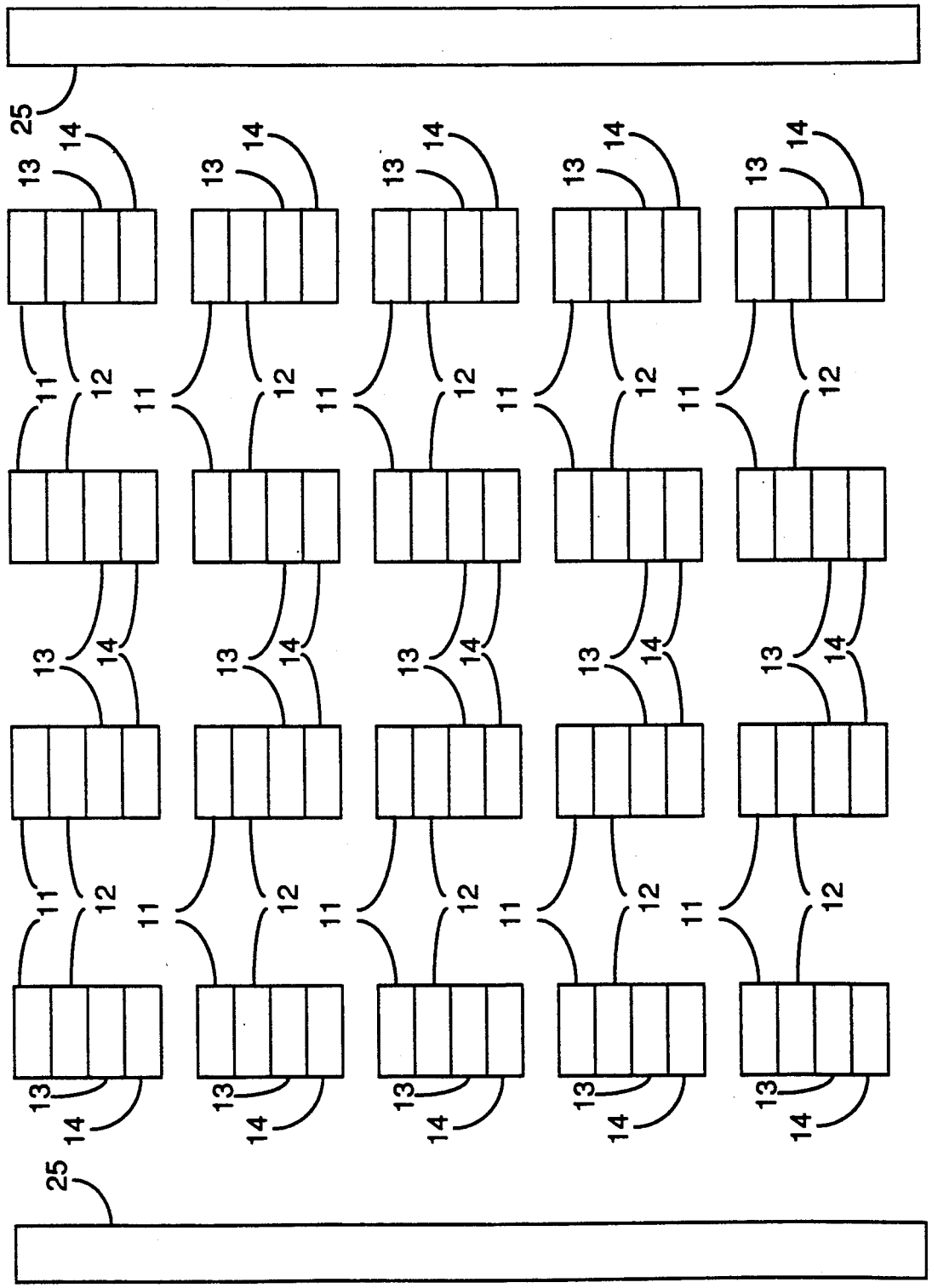
FIG. 5 shows alignment marks from a fourth layer added to the target shown in FIG. 1 in accordance with the preferred embodiment of the present invention.

FIG. 5 shows target area 10 after a fourth layer is etched. After etching the fourth layer, alignment marks 14 are exposed within target area 10. Outside lines 25 from the second layer are also exposed. Outside lines 25 are placed directly over outside lines 24. Each of alignment marks 14, for example, has a width of 1.2 micrometers and a height of 4 micrometers. In the shown example, each of alignment marks 14 is immediately adjacent to one of alignment marks 13.

FIG. 6 shows target area 10 after a fifth layer is etched. After etching the fifth layer, alignment marks 15 are exposed within target area 10. Outside lines 26 from the second layer are also exposed. Outside lines 26 are placed directly over outside lines 25. Each of alignment marks 15, for example, has a width of 1.2 micrometers and a height of 4 micrometers. In the shown example, each of alignment marks 5 is immediately adjacent to one of alignment marks 14.

Embodiments of targets in accordance with the present invention may vary significantly. For example, the exact size of each alignment mark is not significant. Therefore, the height and/or width of alignment marks can vary from layer to layer. Likewise, the distance between the alignment can be varied to account for the addition alignment marks from more than (or less than) five layers.

The outside lines on the left and the right of the alignment marks are used to minimize resist pile up over the target. These all overlap at each masking layer. Even if the lines are broken, this will not impact the alignment of the layers.

The present invention presents a composite target in which alignment marks for each layer are visible for use in the alignment of subsequent layers. This system combines the advantages inherent in a master mark alignment scheme and a sequential mark alignment scheme.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for producing a target used in alignment of layers on a wafer, the method comprising the steps of:
   (a) placing, within a target area, first alignment marks composed of material from a first layer placed on the wafer; and,
   (b) placing, within the target area, subsequent alignment marks composed of material from layers placed on the wafer subsequent to the first layer, wherein the subsequent alignment marks are placed in locations within the target area which are different from locations within the target area in which the first alignment marks are placed;
   wherein in order to align each of the layers placed on the wafer subsequent to the first layer, all visible alignment marks within the target area are used.

2. A method as in claim 1 wherein step (b) includes the substeps of:
   (b.1) placing, within the target area, second alignment marks composed of material from a second layer placed on the wafer subsequent to the first layer, each of the second alignment marks being within the target area and adjacent to one of the first alignment marks; and,
   (b.2) placing, within the target area, third alignment marks composed of material from a third layer placed on the wafer subsequent to the second layer, each of the third alignment marks being within the target area and adjacent to one of the second alignment marks.

3. A method as in claim 2 wherein step (b) additionally includes the substep of:
   (b.3) placing, within the target area, fourth alignment marks composed of material from a fourth layer placed on the wafer subsequent to the third layer, each of the fourth alignment marks being within the target area and adjacent to one of the third alignment marks.

4. A method as in claim 3 wherein the first alignment marks placed in step (a) and the second, the third and the fourth alignment marks placed in step (b) are each rectangular shaped.

5. A target used in alignment of layers on a wafer, the target comprising:
   first alignment marks composed of material from a first layer placed on the wafer placed within a target area in the wafer; and,
   subsequent alignment marks composed of material from layers placed on the wafer subsequent to the first layer, the subsequent alignment marks being placed in locations within the target area which are different from locations within the target area in which the first alignment marks are placed;
   wherein in order to align each of the layers placed on the wafer subsequent to the first layer, all visible alignment marks within the target area are used.

6. A target as in claim 5 wherein the subsequent marks include:
   second alignment marks composed of material from a second layer placed on the wafer subsequent to the first layer, each of the second alignment marks being placed within the target area adjacent to one of the first alignment marks; and,
   third alignment marks composed of material from a third layer placed on the wafer subsequent to the second layer, each of the third alignment marks being placed within the target area adjacent to one of the second alignment marks.

7. A target as in claim 6 wherein the subsequent marks additionally include:
   fourth alignment marks composed of material from a fourth layer placed on the wafer subsequent to the third layer, each of the fourth alignment marks being placed within the target area adjacent to one of the third alignment marks.

8. A target as in claim 7 wherein the first alignment marks, the second alignment marks, the third alignment marks and the fourth alignment marks are each rectangular shaped.

* * * * *

UNITED STATES PATENT AND TRADEMARK OFFICE
CERTIFICATE OF CORRECTION

PATENT NO. : 5,316,984
DATED      : May 31, 1994
INVENTOR(S) : Pierre Leroux

It is certified that error appears in the above-identified patent and that said Letters Patent is hereby corrected as shown below:

Title page, item [75], inventor:    should read --Pierre Leroux --.

Signed and Sealed this

Twelfth Day of January, 1999

Attest:

*Attesting Officer*      *Acting Commissioner of Patents and Trademarks*